United States Patent
Lee et al.

(10) Patent No.: US 10,949,002 B2
(45) Date of Patent: Mar. 16, 2021

(54) CONDUCTIVE FILM AND TOUCH PANEL INCLUDING THE SAME

(71) Applicant: LG ELECTRONICS INC., Seoul (KR)

(72) Inventors: Jihyun Lee, Seoul (KR); Yeontae Choi, Seoul (KR); Jonggoo Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 70 days.

(21) Appl. No.: 14/334,373

(22) Filed: Jul. 17, 2014

(65) Prior Publication Data
US 2015/0253882 A1    Sep. 10, 2015

(30) Foreign Application Priority Data
Mar. 10, 2014  (KR) .......................... 10-2014-0027882

(51) Int. Cl.
*G06F 3/041* (2006.01)
*H05K 1/18* (2006.01)
*H05K 3/32* (2006.01)

(52) U.S. Cl.
CPC ............. *G06F 3/041* (2013.01); *H05K 1/189* (2013.01); *H05K 3/321* (2013.01); *H05K 2201/10128* (2013.01)

(58) Field of Classification Search
None
See application file for complete search history.

(56) References Cited

U.S. PATENT DOCUMENTS

| 8,982,085 B2 * | 3/2015 | Shih ........................ G06F 3/041 345/173 |
| 2009/0153502 A1 | 6/2009 | Jiang et al. |
| 2011/0157087 A1 * | 6/2011 | Kanehira .............. G06F 3/0414 345/174 |
| 2012/0118606 A1 * | 5/2012 | Kim .................... H01L 27/3288 174/126.1 |
| 2012/0299863 A1 * | 11/2012 | Yilmaz ............ G06K 19/07758 345/174 |
| 2013/0299220 A1 * | 11/2013 | Lee .......................... G06F 3/044 174/257 |
| 2014/0049892 A1 * | 2/2014 | Huang .................... G06F 3/044 361/679.21 |
| 2014/0176819 A1 * | 6/2014 | Yilmaz ................. G06F 1/1692 349/12 |

(Continued)

FOREIGN PATENT DOCUMENTS

| CN | 101673001 A | 3/2010 |
| CN | 201765581 U | 3/2011 |

(Continued)

*Primary Examiner* — William Boddie
*Assistant Examiner* — Bipin Gyawali
(74) *Attorney, Agent, or Firm* — Birch, Stewart, Kolasch & Birch, LLP

(57) ABSTRACT

A conductive film for use in a touch panel is provided. The conductive film includes a base member including a sensor area and a wire area, a sensor electrode located on the base member in the sensor area and a wire electrode located on the base member in the wire area, the wire electrode being connected to the sensor electrode. At least one of the sensor electrode and the wire electrode includes a nano material conductor having a network shape.

7 Claims, 15 Drawing Sheets

(56) References Cited

U.S. PATENT DOCUMENTS

| | | | | |
|---|---|---|---|---|
| 2015/0029150 A1* | 1/2015 | Lee | ............... | G06F 3/044 345/174 |
| 2015/0145813 A1* | 5/2015 | Takiguchi | ............... | G06F 3/044 345/174 |
| 2015/0199056 A1* | 7/2015 | Ando | ............... | G06F 3/044 345/174 |
| 2016/0334896 A1* | 11/2016 | Koike | ............... | B32B 15/02 |

FOREIGN PATENT DOCUMENTS

| | | |
|---|---|---|
| CN | 103080876 A | 5/2013 |
| CN | 103559944 A | 2/2014 |
| CN | 103576985 A | 2/2014 |
| JP | 2012-94115 A | 5/2012 |
| JP | 2012-151095 A | 8/2012 |
| KR | 10-2012-0050837 A | 5/2012 |
| KR | 10-2012-0084206 A | 7/2012 |
| KR | 10-2013-0072133 A | 7/2013 |
| TW | 201102906 A | 1/2011 |
| TW | 201347973 A | 12/2013 |
| WO | WO 2012/099394 A2 | 7/2012 |

\* cited by examiner (a)

(b)

(a)

(b)

(a)

(b)

(a)

(b)

CONDUCTIVE FILM AND TOUCH PANEL INCLUDING THE SAME

CROSS-REFERENCE TO RELATED APPLICATION

This application claims the benefit of Korean Patent Application No. 10-2014-0027882, filed on Mar. 10, 2014, in the Korean Intellectual Property Office, the disclosure of which is expressly incorporated herein by reference in its entirety.

BACKGROUND OF THE INVENTION

1. Field of the Invention

The present invention relates to a conductive film and a touch panel including the same.

2. Description of the Related Art

In recent years, conductive films including transparent conductive thin films have been applied in various ways to a variety of electronic devices, such as displays, touch panels, and the like. Such a conductive film is acquired by forming a transparent conductive thin film having low resistance on a plastic substrate and patterning the transparent conductive thin film.

A typical transparent conductive thin film is acquired via vacuum deposition of indium tin oxide. However, the indium tin oxide is expensive and vacuum deposition causes low productivity. Further, the indium tin oxide is inflexible and has difficulty in being applied to flexible electronic devices. Furthermore, the indium tin oxide has high resistance and has difficulty in being applied to large area electronic devices.

SUMMARY OF THE INVENTION

It is an object of the present invention to provide a conductive film which may possess excellent properties and be fabricated using a simplified process and a touch panel including the same.

In accordance with one aspect of the present invention, the above and other objects can be accomplished by the provision of a conductive film for use in a touch panel, the conductive film including a base member in which a sensor area and a wire area are defined, a sensor electrode formed on the base member in the sensor area, and a wire electrode formed on the base member in the wire area, the wire electrode being connected to the sensor electrode, wherein the wire electrode includes a nano material conductor having a network shape.

The sensor electrode may include a nano material conductor having a network shape.

The sensor electrode and the wire electrode may be formed of the same material.

The sensor electrode and the wire electrode may be continuously or successively formed to constitute the same layer and to construct an integrated structure.

The base member may include a folding portion to be folded between the sensor area and the wire area.

The sensor area of the base member and the wire area of the base member, or the sensor electrode and the wire electrode may not be located in the same plane.

A connection area may further be defined in the base member and connected to the wire area, and the conductive film may further include a connection electrode formed in the connection area to interconnect the wire electrode and a touch control unit.

The connection electrode may be formed of the same material as at least one of the sensor electrode and the wire electrode.

The connection electrode, the sensor electrode, and the wire electrode may be successively formed to constitute the same layer and to construct an integrated structure.

The base member may include a folding portion to be folded between the wire area and the connection area and/or between the sensor area and the wire area.

In accordance with another aspect of the present invention, there is provided a touch panel including a first conductive film including a first base member in which a sensor area and a wire area are defined, a first sensor electrode formed on the first base member in the sensor area, and a first wire electrode formed on the base member in the wire area, the first wire electrode being connected to the first sensor electrode, and a second sensor electrode formed in a direction crossing the first sensor electrode so as to be spaced apart from the first sensor electrode, wherein the first wire electrode includes a nano material conductor having a network shape.

The first sensor electrode and the first wire electrode may be successively formed to constitute the same layer and to construct an integrated structure.

The first base member may include a folding portion to be folded between the sensor area and the wire area.

A connection area may further be defined in the first base member and connected to the wire area, and the touch panel may further include a connection electrode formed in the connection area to interconnect the first wire electrode and a touch control unit such that the connection area functions as a flexible printed circuit board.

The first base member may include a folding portion to be folded between the wire area and the connection area and/or between the sensor area and the wire area.

The touch panel may further include a second conductive film including the second sensor electrode, a second wire electrode connected to the second sensor electrode, and a second base member on which the second sensor electrode and the second wire electrode are disposed.

The second base member may successively extend from the first base member such that the first base member and the second base member construct an integrated structure.

A transparent adhesive layer may be interposed between the first conductive film and the second conductive film to attach the first and second conductive films to each other.

The first sensor electrode and the first wire electrode may be formed at one surface of the first conductive film, and the second sensor electrode may be formed at the other surface of the first conductive film.

The touch panel may further include a cover substrate disposed on the first conductive film, and the second sensor electrode may be formed on the cover substrate.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE VARIOUS EMBODIMENTS

Figure 1:
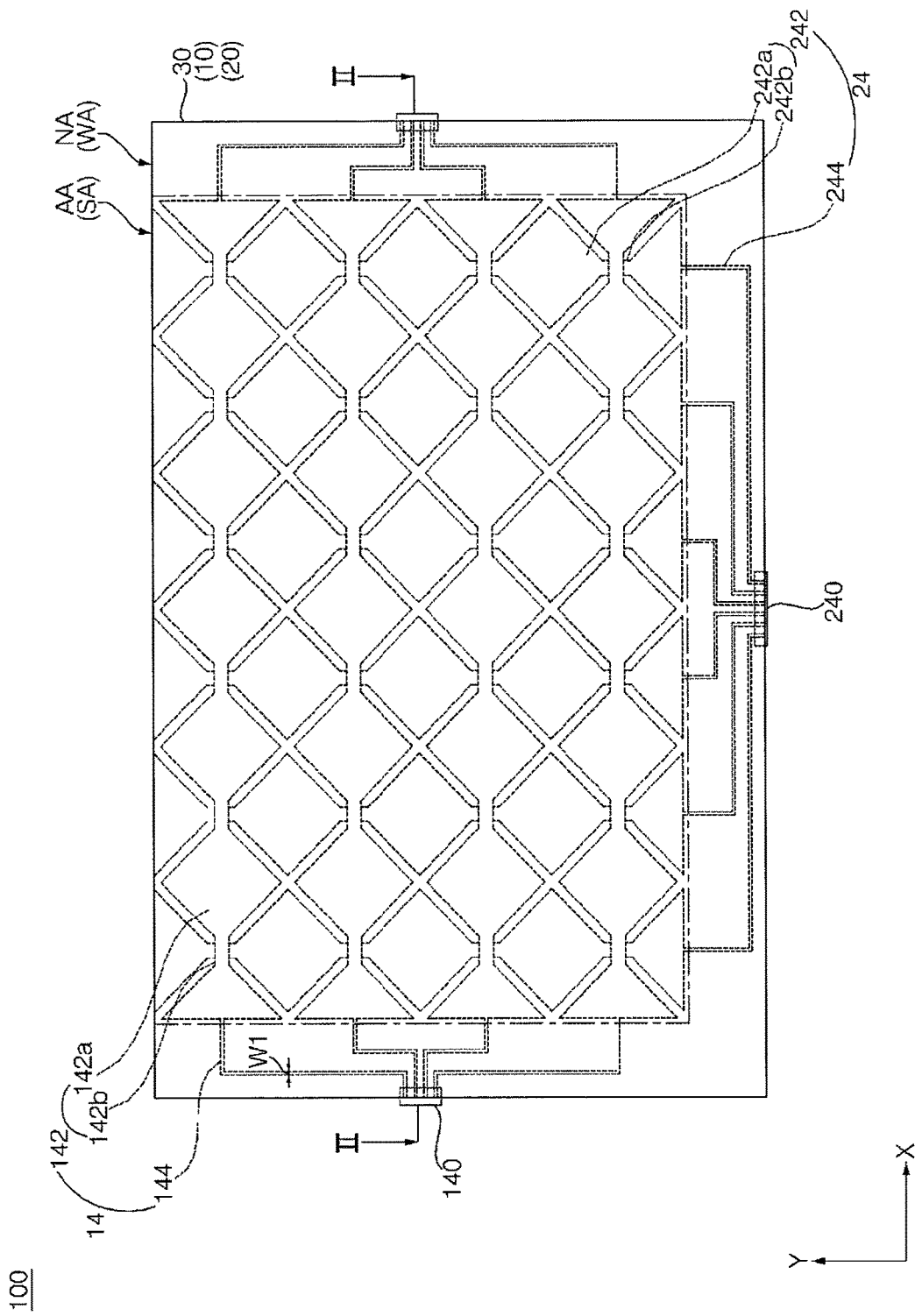
FIG. 1 is a plan view of a touch panel in accordance with one embodiment of the present invention.

Reference will now be made in detail to the various embodiments of the present invention, examples of which are illustrated in the accompanying drawings. However, it will be understood that the present invention should not be limited to the embodiments and may be modified in various ways.

In the drawings, to clearly and briefly explain the present invention, illustration of elements having no connection with the description is omitted, and the same or extremely similar elements are designated by the same reference numerals throughout the specification. In addition, in the drawings, for more clear explanation, the dimensions of elements, such as thickness, width, and the like, are exaggerated or reduced, and thus the thickness, width, and the like of the present invention are not limited to the illustration of the drawings.

In the entire specification, when an element is referred to as "including" another element, the element should not be understood as excluding other elements so long as there is no special conflicting description, and the element may include at least one other element. In addition, it will be understood that, when an element such as a layer, film, region or substrate is referred to as being "on" another element, it can be directly on the other element or intervening elements may also be present. On the other hand, when an element such as a layer, film, region or substrate is referred to as being "directly on" another element, this means that there are no intervening elements therebetween. The term "first" or "second" in the detailed description is merely used to distinguish two components from each other, and the present invention is not limited to these terms.

Hereinafter, a touch panel and a fabrication method thereof as well as a conductive film included in the touch panel and a fabrication method thereof will be described in detail with reference to the accompanying drawings.

Figure 2:
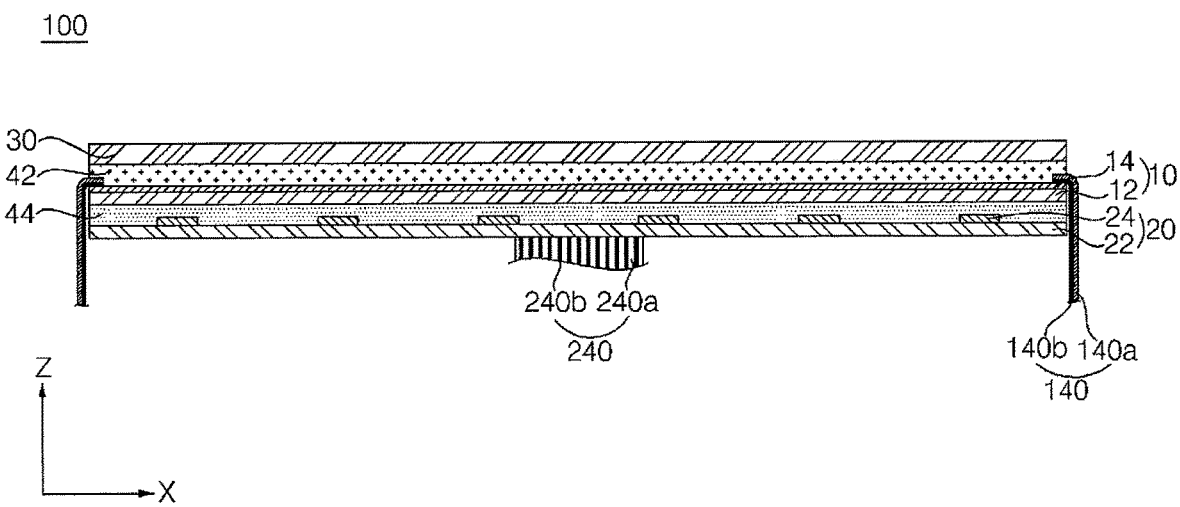
FIG. 2 is a sectional view taken along line II-II of FIG. 1.

FIG. 1 is a plan view of a touch panel in accordance with one embodiment of the present invention, and FIG. 2 is a sectional view taken along line II-II of FIG. 1.

As exemplarily shown in FIGS. 1 and 2, the touch panel, designated by reference numeral 100, in accordance with the present embodiment may include an available area AA and an unavailable area NA located around the available area AA. The available area AA is an area in which sensor electrodes 142 and 242 are arranged to sense touch by the user's hand and an input device, such as, for example, a stylus pen. The unavailable area NA is an area where flexible printed circuit boards (FPCBs) 140 and 240, wire electrodes 144 and 244 connected to the flexible printed circuit boards 140 and 240, and the like are arranged, the flexible printed circuit boards 140 and 240 being connected to an external component (e.g., external circuit, such as, for example, a touch control unit (see reference numeral 200 of FIG. 3) that is incorporated in a display apparatus to control the touch panel 100) to transfer information sensed in the available area AA. In addition, a bezel, a black printed layer, or the like may be located in the unavailable area NA, the bezel or the black printed layer serving to physically secure various layers, elements, and the like constituting the touch panel 100 and to hide various components arranged in the unavailable area NA.

The touch panel 100 in accordance with the present embodiment includes a first conductive film 10 including a first electrode 14, and a second electrode 24 located to be insulated from the first electrode 14. More specifically, the first conductive film 10 includes a first base member 12, and the first electrode 14 formed on the first base member 12. Here, the first electrode 14 includes a first sensor electrode 142 extending in a first direction, and a first wire electrode 144 connected to the first sensor electrode 142. In the present embodiment, the second electrode 24 may be disposed on a second base member 22 to form a second conductive film 20. Here, the second electrode 24 may be spaced apart from the first sensor electrode 142 so as to be insulated therefrom. The second electrode 24 may include a second sensor electrode 242 extending in a second direction crossing the first sensor electrode 142, and a second wire electrode 244 connected to the second sensor electrode 242.

In addition, the first wire electrode 144 may be connected to the first flexible printed circuit board 140 that is connected to an external component (more particularly, the touch control unit 200), and the second wire electrode 244 may be connected to the second flexible printed circuit board 240 that is connected to an external component (more particularly, the touch control unit 200). The touch panel 100 may further include a cover substrate 30, a first transparent adhesive layer 42 attaching the cover substrate 30 and the first conductive film 10 to each other, and a second transparent adhesive layer 44 attaching the first conductive film 10 and the second conductive film 20 to each other. This will be described in more detail.

The cover substrate 30 may be formed of a material that may protect the touch panel 100 from external shock and permit transmission of light through the touch panel 100. In one example, the cover substrate 30 may be formed of glass, and the like. However, the present invention is not limited thereto, and various alterations related to constituent materials of the cover substrate 30 are possible.

The first transparent adhesive layer 42 is interposed between the cover substrate 30 and the first conductive film 10 to bond the same to each other, and the second transparent adhesive layer 44 is interposed between the first conductive film 10 and the second conductive film 20 to bond the same to each other. As such, a plurality of layers constituting the touch panel 100 may be integrated with one another by the first and second transparent adhesive layers 42 and 44. In this case, the first and second conductive films 10 and 20 attached respectively to the first and second flexible printed circuit boards 140 and 240 are bonded to the first transparent adhesive layer 42 and/or the second transparent adhesive layer 44.

The first and second transparent adhesive layers 42 and 44 may be formed of a material that has adhesion to permit attachment of layers stacked at both sides thereof as well as light transmittance, such as an optically clear adhesive (OCA). The optically clear adhesive may exhibit high adhesive strength, moisture-proofing and heat-resisting properties, ease in foaming and processing, and the like, and may prevent deterioration of the first electrode 14 and/or the second electrode 24. The first and second transparent adhesive layers 42 and 44 may be formed of various known optically clear adhesives.

The first and second conductive films 10 and 20 are disposed on the cover substrate 30 (more particularly, on a lower surface of the cover substrate 30 in the drawing). The first conductive film 10 may include the first base member 12 and the first electrode 14 formed on the first base member 12, the first electrode 14 including the first sensor electrode 142 and the first wire electrode 144. The second conductive film 20 may include the second base member 22 and the second electrode 24 formed on the second base member 22, the second electrode including the second sensor electrode 242 and the second wire electrode 244. The first sensor electrode 142 may extend in a first direction (in the X-axis of the drawing), and the second sensor electrode 242 may extend in a second direction (in the Y-axis of the drawing) crossing (for example, perpendicular to) the first sensor electrode 142. However, the present invention is not limited thereto, and various alterations related to the extending directions of the first and second sensor electrodes 142 and 242 are possible.

Although the present embodiment illustrates that the first electrode 14 is formed on the first base member 12 to form the first conductive film 10 and the second electrode 24 is formed on the second base member 22 to form the second conductive film 20, the present invention is not limited thereto, and various alterations are possible. This will be described later in more detail with reference to FIGS. 12 to 15.

Each of the first and second base members 12 and 22 may be a film, a sheet, a substrate, or the like, which is formed of a material that has light transmittance and insulation properties and is capable of maintaining the mechanical strength of the first and second conductive films 10 and 20. The first and second base members 12 and may be formed of at least one of polyethylene, polypropylene, polyethylene terephthalate, polyethylene-2,6-naphthalate, polypropylene terephthalate, polyimide, polyamideimide, polyethersulfone, polyetheretherketone, polycarbonate, polyarylate, cellulose propionate, polyvinylchloride, polyvinylidene chloride, polyvinyl alcohol, polyetherimide, polyphenylensulfide, polyphenyleneoxide, polystyrene, and the like. In one example, the first and second base members 12 and 22 may be formed of polyethylene terephthalate. However, the present invention is not limited thereto, and the first and second base members 12 and 22 may be formed of various other materials except for the aforementioned materials.

In the present embodiment, the first base member 12 or the first conductive film 10 may be divided into or defined by a sensor area SA where the first sensor electrode 142 is arranged to substantially sense touch, and a wire area WA where the first wire electrode 44 is arranged, the wire area WA being located around the sensor area SA. In the present embodiment, the sensor area SA may be equal to (e.g., may overlap or coincide with) the available area AA and the wire area WA may be equal to (e.g., may overlap or coincide with) the unavailable area NA.

The first sensor electrode 142 located in the sensor area SA may include a plurality of first sensor portions 142a, which define a pattern having a given area to sense touch, and first extensions 142b interconnecting the first sensor portions 142a in the first direction.

The first sensor portions 142a serve to substantially sense contact of an input device, such as, for example, a finger. The drawing illustrates that the first sensor portions 142a have a diamond shape and occupy a wide area in the sensor area SA or the available area AA along with the second sensor portions 242a to effectively sense touch. However, the present invention is not limited thereto, and the first sensor portions 142a may have any one of various other shapes, such as a triangular, rectangular, polygonal, circular, or oval shape. The first extensions 142b interconnect the first sensor portions 142a in the first direction. As such, the first sensor electrode 142 may extend by a long length in the first direction in the sensor area SA or the available area AA.

The first wire electrode 144 located in the wire area WA extends from an end of the first sensor electrode 142 and is connected to the first flexible printed circuit board 140. The first wire electrode 144 includes a portion located in a direction crossing the first direction (crossing the X-axis of the drawing), such as in a direction tilted to or perpendicular to the first direction, which may allow the first wire electrode 144 to be located in the unavailable area NA and to occupy a relatively small area. Explaining this in more detail, to connect the first sensor portions 142a of the first sensor electrode 142 to the first flexible printed circuit board 140, the first wire electrode 144 is located in a partial region of the wire area WA (in a central region of the drawing). As such, a portion of the first wire electrode 144 is perpendicular to or tilted to the first direction.

Accordingly, each of the first sensor electrode 142 and the first wire electrode 144 is formed of a transparent conductive material having conductivity and light transmittance. In particular, in the present embodiment, the first wire electrode 144 is formed of a transparent conductive material, differently from the related art. In one example, the first sensor electrode 142 may include a nano material conductor having a network (mesh) shape (for example, a metal nanowire, such as a silver nanowire, a copper nanowire, a platinum nanowire, or the like). Similarly, the first wire electrode 144 may include a nano material conductor having a network (mesh) shape (for example, a metal nanowire, such as a silver nanowire, a copper nanowire, a platinum nanowire, or the like).

In a case in which the first sensor electrode 142 and the first wire electrode 144 include a transparent conductive nano material conductor, these electrodes 142 and 144 may be formed using wet coating, which is less expensive than deposition. That is, the first sensor electrode 142 and the first wire electrode 144 may be formed together by wet coating a paste, ink, mixture, solution, or the like, which includes a nano material conductor, such as a nanowire or the like, and then patterning the same. In this case, the density of a nano metal material in the solution, mixture, paste or the like used during wet coating is extremely low (for example, 1% or less). In this way, costs required for formation of the first sensor electrode 142 and the first wire electrode 144 may be reduced, resulting in enhanced production efficiency.

In addition, the first sensor electrode 142 and the first wire electrode 144, formed of a nano metal material, have light transmittance, low resistance, and excellent electrical properties. In one example, a nano particle surface of silver (Ag) has several crystal faces to easily induce anisotropic growth, which permits easy fabrication of a silver nanowire. The silver nanowire has a resistance of approximately 10 Ω/sq to 400 Ω/sq, and thus the resulting electrode may have a low resistance (for example, 10 Ω/sq to 150 Ω/sq). As such, the first sensor electrode 142 and the first wire electrode 144 may have various resistances. In particular, as compared to an electrode formed of indium tin oxide having a resistance of approximately 200 Ω/sq to 400 Ω/sq, the first sensor electrode 142 and the first wire electrode 144 may have greater electrical conductivity. Further, the silver nanowire may have higher transmittance than the indium tin oxide, and for example, may have transmittance of 90% or more. Furthermore, the silver nanowire is flexible, and thus may be applied to flexible devices, and may have stability in the supply and demand of materials.

The nanowire as described above (more particularly, the silver nanowire), for example, may have a radius of 10 nm to 60 nm and a length of 10 μm to 200 μm. With this dimensional range, a good aspect ratio (for example, 1:300~1:20000) suitable to effectively attain a network shape may be achieved and the first sensor electrode 142 and the first wire electrode 144 may not be visible. However, the present invention is not limited thereto, and the nanowire may have various other radii, lengths, and aspect ratios.

In summary, in the present embodiment, the first sensor electrode 142 and the first wire electrode 144 include a nano material conductor having a network shape, thus achieving reduced material costs and improved various properties.

In addition, in the present embodiment, since both the first sensor electrode 142 and the first wire electrode 144 include a nano material conductor having a network shape, the first sensor electrode 142 and the first wire electrode 144 may be formed together via the same process (i.e., the same wet process and the same patterning process). As such, the first sensor electrode 142 and the first wire electrode 144 have the same stacking configuration. This may further simplify formation of the first sensor electrode 142 and the first wire electrode 144, thus increasing production efficiency thereof. In this case, the first sensor electrode 142 and the first wire electrode 144 may be formed of the same material may have the same or similar thickness (for example, having a thickness difference less than 10%), and may continuously extend to construct an integrated structure.

The drawing illustrates that the first wire electrode 144 is located at either end of the first sensor electrode 142, and thus has a double routing configuration. This serves to reduce a resistance of the first sensor electrode 142 having a relatively long length so as to prevent loss due to resistance. However, the present invention is not limited thereto, and various other configurations, such as, for example, a configuration in which the first wire electrode 144 is connected to only one end of the first sensor electrode 142, and thus has a single routing configuration, are possible.

In addition, the drawing illustrates that the first wire electrode 144 is connected to an external component through two unavailable areas NA located at both sides of the available area AA. However, the present invention is not limited thereto, and the first wire electrode 144 may be connected to an external component through one unavailable area NA located at one side of the available area AA, or may extend to an area above or below the available area AA and be connected to an external component through the corresponding area. Various other alterations are possible.

The first flexible printed circuit board 140 for connection with an external component may be connected to the first wire electrode 144. The first flexible printed circuit board 140 may include a base member 140a, and a wire 140b formed on the base member 140a. As the wire 140b of the first flexible printed circuit board 140 and the first wire electrode 144 come into contact with each other, the first wire electrode 144 and the first flexible printed circuit board 140 may be electrically connected to each other. However, the present invention is not limited thereto, and a conductive adhesive member, such as an anisotropic conductive adhesive (ACA), an anisotropic conductive paste (ACP), an anisotropic conductive film (ACF), or the like, may be interposed between the wire 140b of the first flexible printed circuit board 140 and the first wire electrode 144 to electrically connect the same to each other.

The drawing illustrates that the first flexible printed circuit board 140 is located in each unavailable area NA. However, the present invention is not limited thereto, and various other alterations, such as, for example, an alteration in which a plurality of first flexible printed circuit boards 140 is arranged in each unavailable area NA, are possible.

In the present embodiment, in a case in which the first wire electrode 144 includes a nano material conductor having a network shape, the first wire electrode 144 may exhibit low possibility of breakage and strong surface adhesion. Thus, even after the first flexible printed circuit board 140 is attached to the first wire electrode 144, the first wire electrode 144 may maintain excellent electrical properties.

In the present embodiment, thicknesses, widths, and the like of the first sensor electrode 142 and the first wire electrode 144 may be altered in various ways in consideration of the size of the touch panel 100, required resistance values, compositions of constituent materials of the first sensor electrode 142 and the first wire electrode 144, and the like. In this case, the first sensor electrode 142 and the first wire electrode 144, which include a metal nanowire having a network shape, may have minimized thicknesses. That is, in the present embodiment, the first sensor electrode 142 and the first wire electrode 144 may have a nanometer range of thicknesses (e.g., in a range of 1 nm to 999 nm). For example, the first sensor electrode 142 and the first wire electrode 144 may have thicknesses in a range of 50 nm to 3000 nm (for example, in a range of 100 nm to 3000 nm, more particularly, in a range of 100 nm to 200 nm). In addition, a width W1 of the first wire electrode 144 may be in a range from micrometers to millimeters (e.g., 1 μm to 99 mm). For example, the width W1 of the first wire electrode 144 may be in a range of 100 μm to 30 mm (for example, 100 μm to 2 mm). Accordingly, in the present embodiment, it will be appreciated that the first wire electrode 144 has a considerably smaller thickness than the width W1 thereof. For example, a ratio of the thickness to the width W1 of the first wire electrode 144 may be in a range of 1:500 to 1:3000 (for example, in a range of 1:1000 to 1:10000). Accordingly, in the present embodiment, the first wire electrode 144 has a relatively reduced thickness, thus having reduced material costs and high resistance.

On the other hand, in the case of a conventional wire electrode formed of a paste containing metal powder (for example, a silver (Ag) paste), the wire electrode has a micrometer range of thickness (for example, in a range of 5 μm to 8 μm). As such, a ratio of the thickness to the width of the wire electrode is approximately in a range of 1:10 to 1:20 that is greatly different from that of the present embodiment.

The second sensor electrode 242 located in the sensor area SA may include a plurality of second sensor portions 242a, which define a pattern having a given area to sense touch, and second extensions 242b interconnecting the second sensor portions 242a in the second direction (in the y-axis of the drawing).

The second sensor portions 242a serve to substantially sense contact of an input device, such as, for example, a finger. Although the drawing illustrates that the second sensor portions 242a have a diamond shape, the present invention is not limited thereto. Thus, the second sensor portions 242a may have any one of various other shapes, such as a triangular, rectangular, polygonal, circular, or oval shape. The second extensions 242b interconnect the first sensor portions 242a in the second direction. As such, the second sensor electrode 242 may extend by a long length in the second direction in the sensor area SA or the available area AA.

The second wire electrode 244 located in the wire area WA extends from an end of the second sensor electrode 242 and is connected to the second flexible printed circuit board 240. The second wire electrode 244 includes a portion located in a direction crossing the second direction (crossing the y-axis of the drawing), such as in a direction tilted to or perpendicular to the second direction, which may allow the second wire electrode 244 to be located in the unavailable area NA and to occupy a relatively small area. Explaining this in more detail, to connect the second sensor portions 242a of the second sensor electrode 242 to the second flexible printed circuit board 240, the second wire electrode 244 is located in a partial region of the wire area WA (in a central region of the drawing). As such, a portion of the second wire electrode 244 is perpendicular to or tilted to the second direction.

The second sensor electrode 242 and the second wire electrode 244 may be formed from similar materials and similar thicknesses, widths, and the like of the first sensor electrode 142 and the first wire electrode 144. Thus, a detailed description thereof will be omitted.

The drawing illustrates that the second wire electrode 244 is located below the second sensor electrode 242, and thus has a single routing configuration. As such, the second wire electrode 244 is formed in an unavailable area NA (hereinafter, referred to as a second unavailable area NA) located below the available area AA. However, the present invention is not limited thereto, and the second wire electrode 244 may be located at one or more areas at the upper and lower sides and the left and right sides of the available area AA, and various other alterations are possible.

The second flexible printed circuit board 240 for connection with an external component may be connected to the second wire electrode 244. The second flexible printed circuit board 240 may include a base member 240a, and a wire 240b formed on the base member 240a. As the wire 240b of the second flexible printed circuit board 240 and the second wire electrode 244 come into contact with each other, the second wire electrode 244 and the second flexible printed circuit board 240 may be electrically connected to each other. However, the present invention is not limited thereto, and a conductive adhesive member, such as an anisotropic conductive adhesive (ACA), an anisotropic conductive paste (ACP), an anisotropic conductive film (ACF), or the like, may be interposed between the wire 240b of the second flexible printed circuit board 240 and the second wire electrode 244 to electrically connect the same to each other.

In the drawings and the above description, for clear and brief explanation, the first conductive film 10 is illustrated and described as including the first base member 12, the first sensor electrode 142, and the first wire electrode 144 and the second conductive film 20 is illustrated and described as including the second base member 22, the second sensor electrode 242, and the second wire electrode 244. However, the present invention is not limited thereto. Thus, each of the first and second conductive films 10 and 20 may further include an over-coating layer or a hard-coating layer for protection, an adhesive layer to enhance adhesion between stacking layers, a primer layer, or the like. The first and second conductive films 10 and 20 may have various other configurations.

When an input device, such as, for example, a finger comes into contact with the first and second sensor electrodes 142 and 242, a capacitance difference occurs at a contact position of the input device, and the position where the capacitance difference occurs may be detected as a touch position.

In the related art, a sensor electrode is formed of indium tin oxide and a wire electrode is formed of a general metal material that is not a nano material. Thus, the sensor electrode and the wire electrode must be formed via different processes, which may result in deterioration of production efficiency. That is, fabrication of a conductive film having desired shapes of a sensor electrode and a wire electrode requires a complicated process. This will now be described in more detail. First, a conductive film, which includes a base member and a conductive layer formed on the entire base member using indium tin oxide, is prepared. Then, the conductive film is subjected to shrinkage via annealing, to prevent variation in the size of upper and lower portions thereof. Thereafter, the conductive layer is patterned via developing, etching, and the like to form a sensor electrode, and a paste containing a metal material (for example, a metal material having a particle size in a micrometer range of 1 μm to 999 μm, more particularly, a metal material in the form of a plate having a thickness of 1 μm to 2 μm) is printed in a wire electrode form and thereafter, subjected to drying to form a wire electrode. That is, fabrication of the conductive film including desired shapes of the sensor electrode and the wire electrode requires the above described complicated process. Consequently, fabrication of a touch panel including the conductive film is extremely complicated, resulting in deterioration of production efficiency. Further, since the wire electrode is formed by printing the paste containing the metal material having a micrometer size, reduction in the width of the wire electrode is limited due to material and process limits, and consequently reduction in the width of the unavailable area that greatly depends on the width of the wire electrode is limited. Furthermore, precise adjustment of process conditions is necessary for alignment of the wire electrode and the sensor electrode.

In a case in which the wire electrode is formed of indium tin oxide in the same manner as the sensor electrode for enhancement of production efficiency, disconnection, breakage, or the like may occur due to rigid properties of the wire electrode that must have a smaller width and be more densely arranged than the sensor electrode. In addition, due to high possibility of breakage and low surface adhesion of the indium tin oxide, electrical connection may be impossible, or electrical properties may be considerably deteriorated once a flexible printed circuit board has been attached to the wire electrode.

On the other hand, in the present embodiment, the wire electrodes (the first wire electrode 144 and/or the second wire electrode 244) include a nano material conductor having a network shape, and the wire electrodes 144 and 244 and the sensor electrodes (the first sensor electrode 142 and/or the second sensor electrode 242) may be formed together via the same process. In one example, to form the wire electrodes 144 and 244 and the sensor electrodes 142 and 242 together, a paste containing a nano material conductor having a network shape may be wet coated on the entire base material, and then be patterned via etching, and the like. As such, formation and patterning of the wire electrodes 144 and 244 is not implemented separately from formation and patterning of the sensor electrodes 142 and 242, which may considerably simplify the entire process. Further, annealing that has been implemented in the related art may be omitted. The annealing is implemented to prevent shrinkage of the conductive film during drying of the paste constituting the wire electrode. In the present embodiment, since the wire electrodes 144 and 244 are formed of the same paste, drying and annealing of the paste may be omitted. Furthermore, due to the fact that the wire electrodes 144 and 244 are formed of the same paste, the wire electrodes 144 and 244 may be fabricated with reduced material costs.

Figure 3:
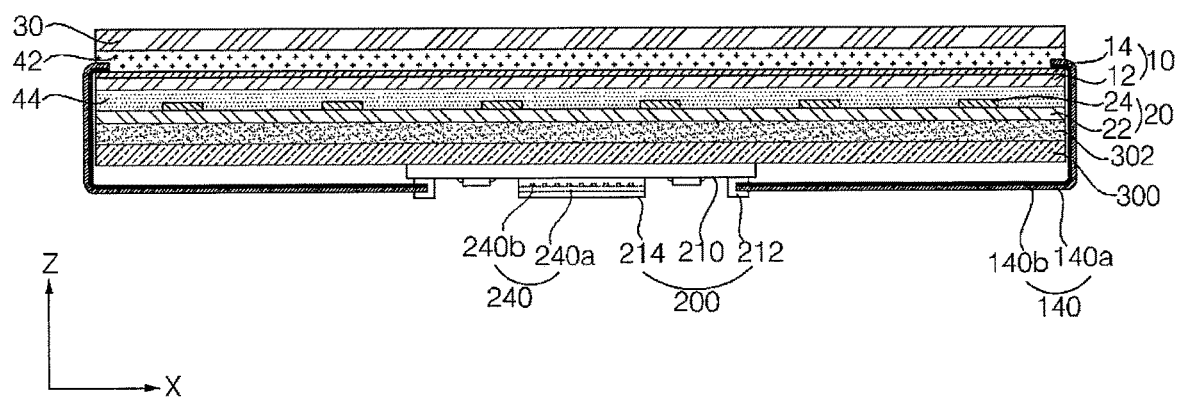
FIG. 3 is a sectional view showing a display apparatus including the touch panel shown in FIG. 1.

A display apparatus including the touch panel 100 described above will be described below in more detail with reference to FIGS. 3 and 4. FIG. 3 is a sectional view showing a display apparatus including the touch panel shown in FIG. 1, and FIG. 4 is a rear perspective view schematically showing the display apparatus including the touch panel shown in FIG. 1.

Figure 4:
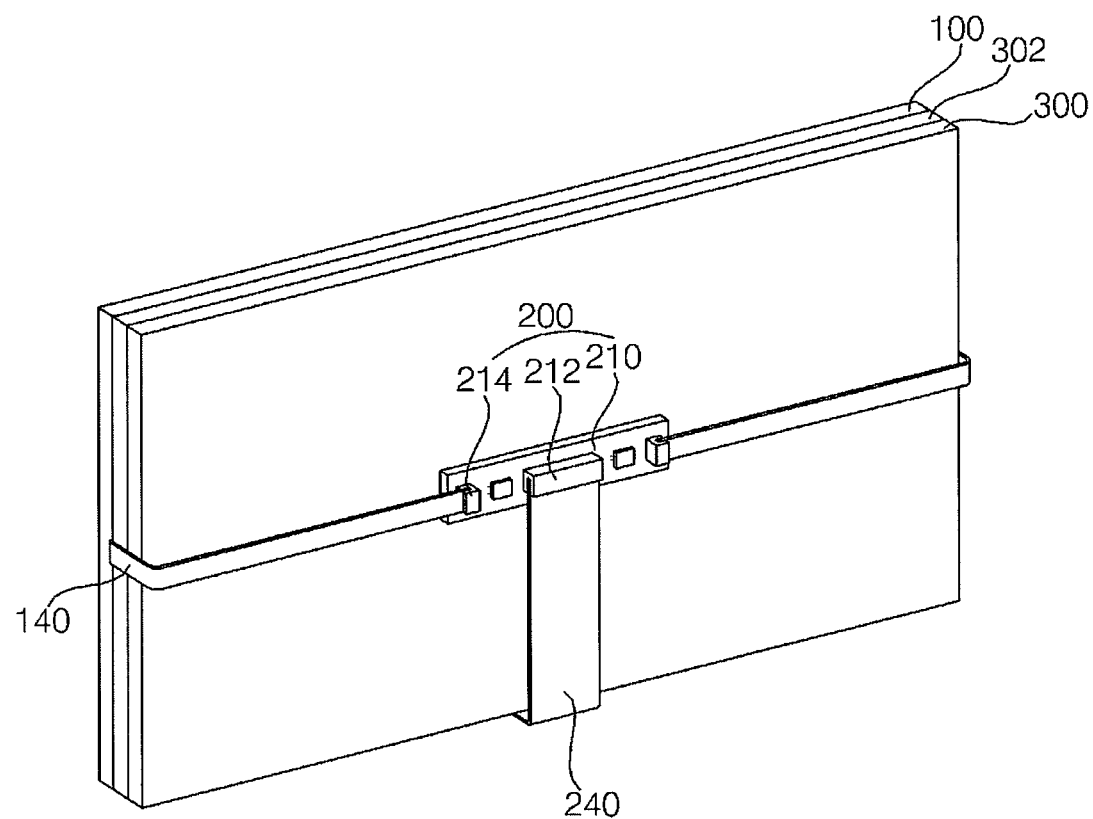
FIG. 4 is a rear perspective view schematically showing the display apparatus including the touch panel shown in FIG. 1.

Referring to FIGS. 3 and 4, in the display apparatus in accordance with the present embodiment, the touch panel 100 may be disposed on a front surface of a display panel 300 using a transparent adhesive layer 302. The transparent adhesive layer 302 may be formed of one or more various known materials. Other configurations, types, and the like of the transparent adhesive layer 302 may be employed so long as they allow the touch panel 100 to be disposed on the front surface of the display panel 300.

In this case, the first and second flexible printed circuit boards 140 and 240, which extend from the wire electrodes (144 and 244 of FIG. 1) of the touch panel 100, are connected to the touch control unit 200 disposed at a rear surface of the display panel 300. The touch control unit 200 may serve to receive touch information sensed by the sensor electrodes 142 and 144 of the touch panel 100 and to transmit the same to the display apparatus, for example. The touch control unit 200 may include a printed circuit board 210 including, for example, an Integrated Circuit (IC) chip, and connectors 212 and 214 disposed on the printed circuit board 210 and connected respectively to the first and second flexible printed circuit boards 140 and 240. Various known configurations of the touch control unit 200 including the printed circuit board 210, the connectors 212 and 214, and the like may be applied.

The above described embodiment illustrates that the first electrode 14 includes the first sensor electrode 142 and the first wire electrode 144, each of which includes a nano material conductor having a network shape, and the second electrode 24 includes the second sensor electrode 242 and the second wire electrode 244, each of which includes a nano material conductor having a network shape. However, the present invention is not limited thereto, and at least one of the first and second wire electrodes 144 and 244 may include a nano material conductor having a network shape, or may construct the same layer as the first or second sensor electrode 142 or 242.

In addition, the present embodiment illustrates that the first electrode 14 is disposed on a surface of the first base member 12 facing the cover substrate 30 and the second electrode 24 is disposed on a surface of the second base member 22 facing the cover substrate 30. However, the present invention is not limited thereto, and the first electrode 14 may be disposed on a surface of the first base member 12 opposite to the cover substrate 30, and/or the second electrode 24 may be disposed on a surface of the second base member 22 opposite to the cover substrate 30. Various other alterations are possible.

A fabrication method of the first or second conductive film 10 or 20 included in the above described touch panel 100 will be described in detail with reference to FIGS. 5A to 5D.

FIGS. 5A to 5D are views showing a method for fabricating the first conductive film 10 of the touch panel 10 in accordance with the embodiment of the present invention. Although FIGS. 5A to 5D illustrate the first conductive film 10, the present invention is not limited thereto. Accordingly, it will be appreciated that the following description may also be applied to fabrication of the second conductive film 20. More specifically, in FIGS. 5A to 5D, (a) is a plan view, and (b) is a sectional view taken along line V-V. Hereinafter, a detailed description related to the above described parts will be omitted and only different parts will be described in detail.

Figure 5A:
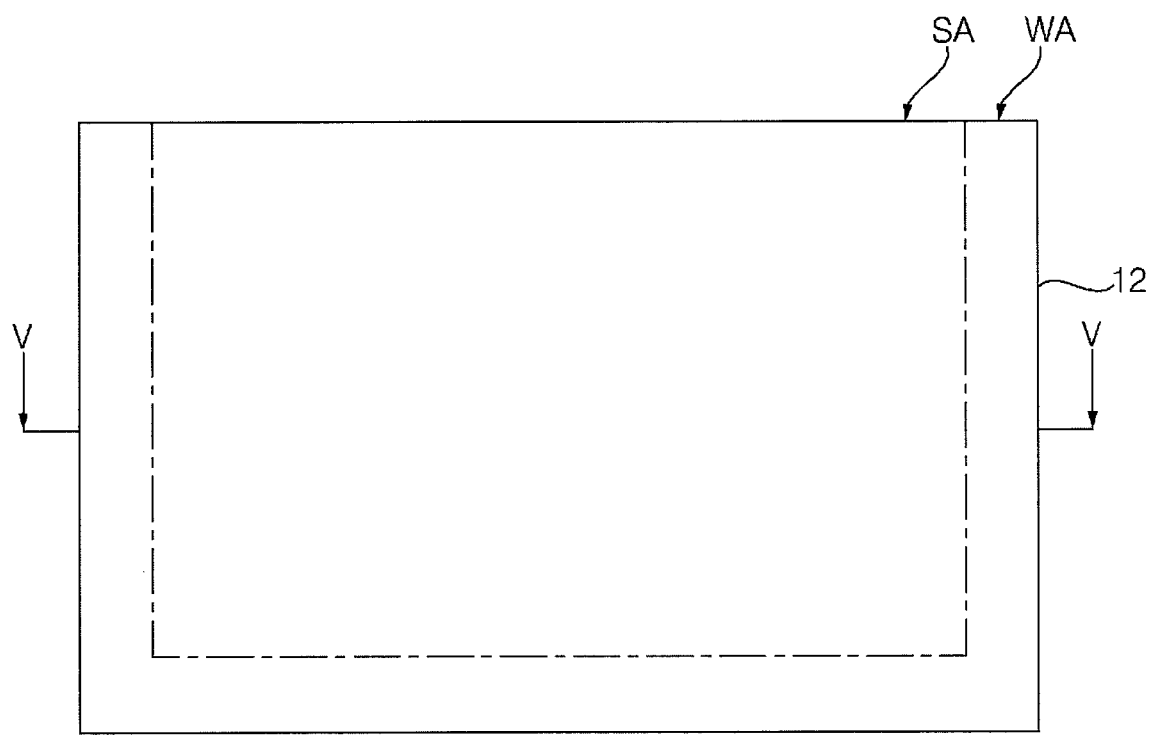
FIGS. 5A to 5D are views showing a method for fabricating a first conductive film of the touch panel in accordance with the embodiment of the present invention.
Figure 5A:
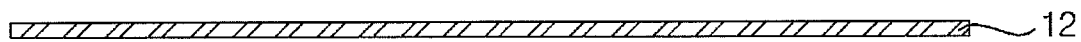

First, as exemplarily shown in FIG. 5A, the first base member 12 is prepared.

Figure 5B:
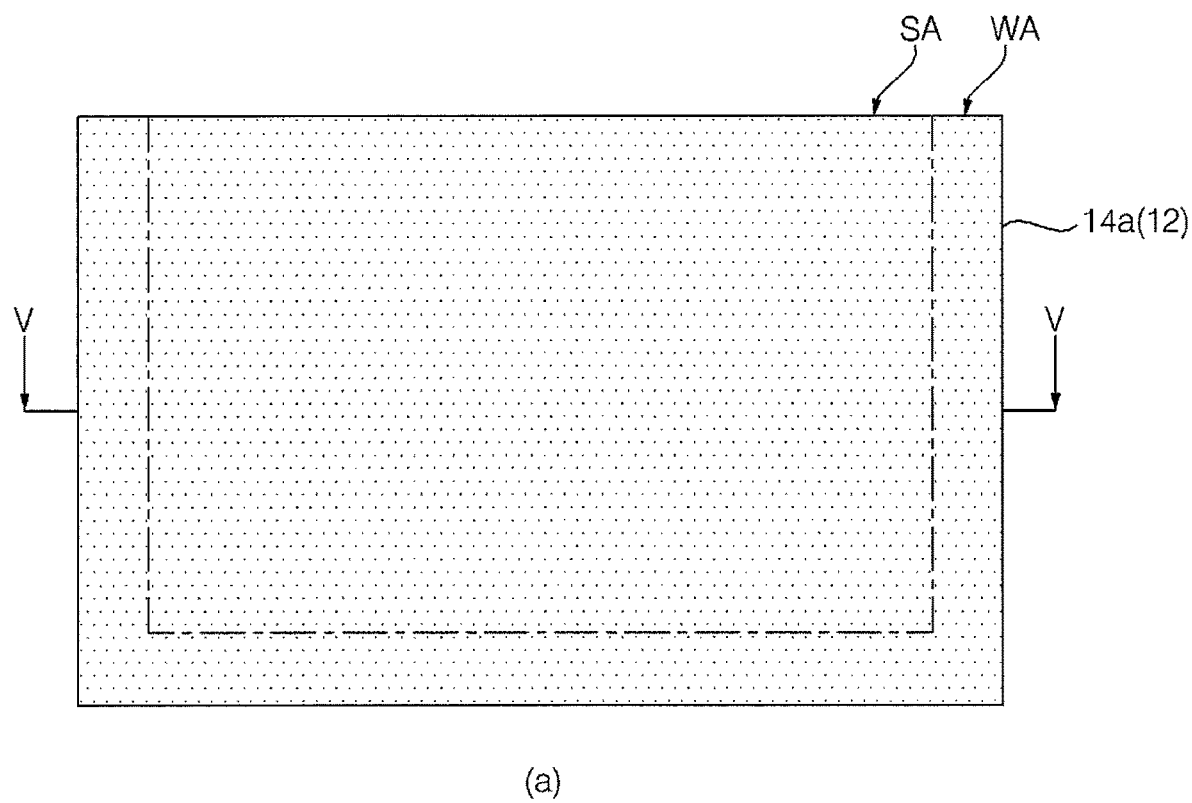
Figure 5B:
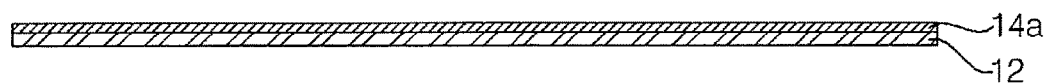

Next, as exemplarily shown in FIG. 5B, a conductive layer 14a is formed on the entire surface of the first base member 12. The conductive layer 14a may be formed of a transparent conductive material. In one example, the conductive layer 14a may be formed by applying a mixture including a nano material conductor having a network shape by wet coating, and thereafter drying the same. As such, the conductive layer 14a having excellent properties may be formed via a simplified process.

Figure 5C:
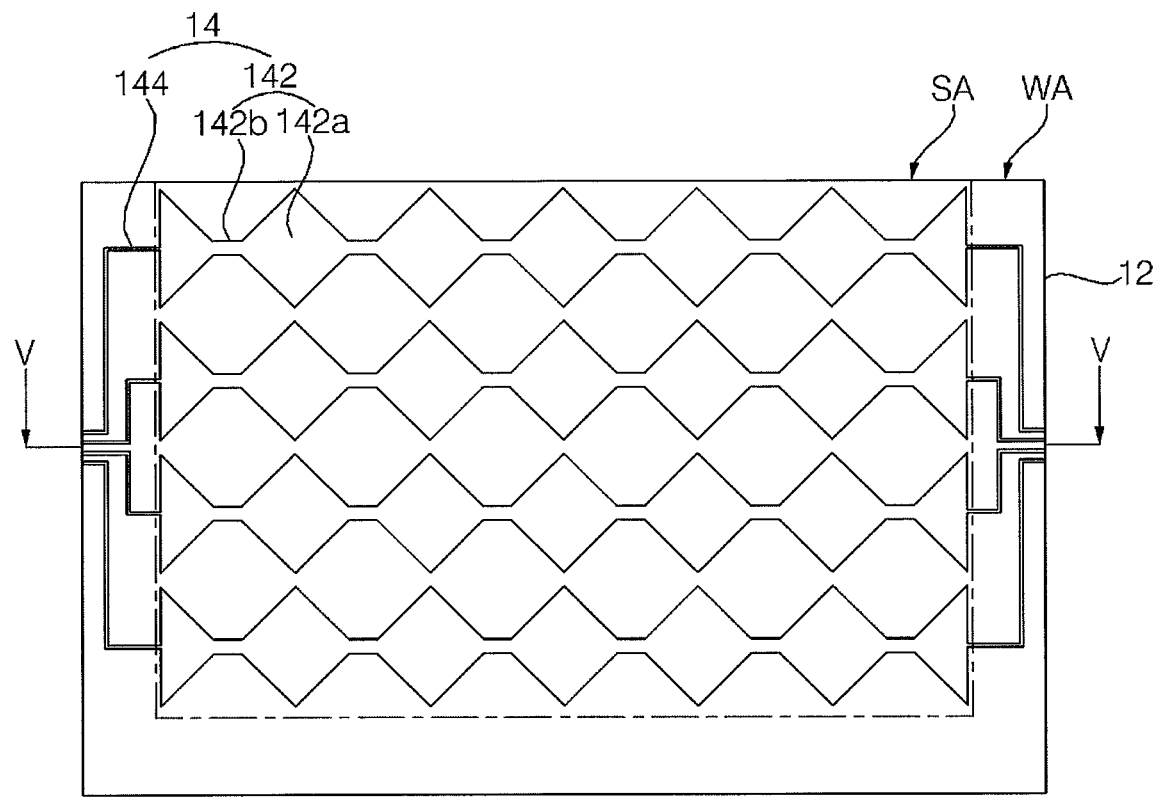
Figure 5C:
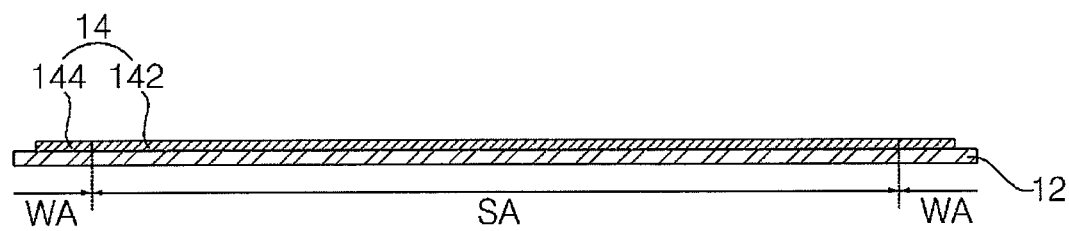

Next, as exemplarily shown in FIG. 5C, the conductive layer (14a of FIG. 5B) is patterned to form the first sensor electrode 142 in the sensor area SA and to form the first wire electrode 144 in the wire area WA. A photolithography process may be used to pattern the conductive layer 14a. More specifically, a resist layer is formed on the conductive layer 14a and then subjected to exposure and developing to form a mask layer. Thereafter, the first sensor electrode 142 and the first wire electrode 144 may be formed by etching a portion of the conductive layer 14a not covered with the mask layer. By patterning the first electrode 14 using the photolithography process described above, the first electrode 14 may have a small width.

In the present embodiment, the first sensor electrode 142 and the first wire electrode 144 are formed via the same process by patterning the single conductive layer 14a as described above, which may simplify formation of the first sensor electrode 142 and the first wire electrode 144.

Figure 5D:
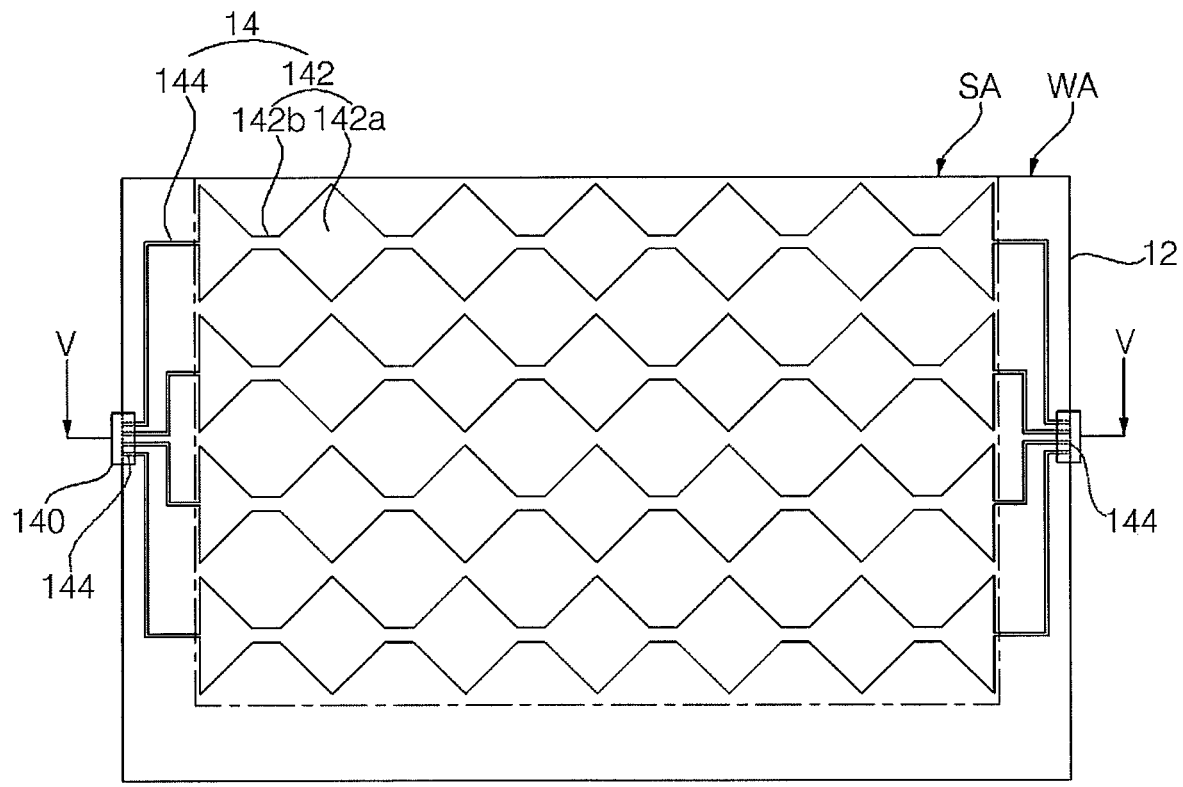
Figure 5D:
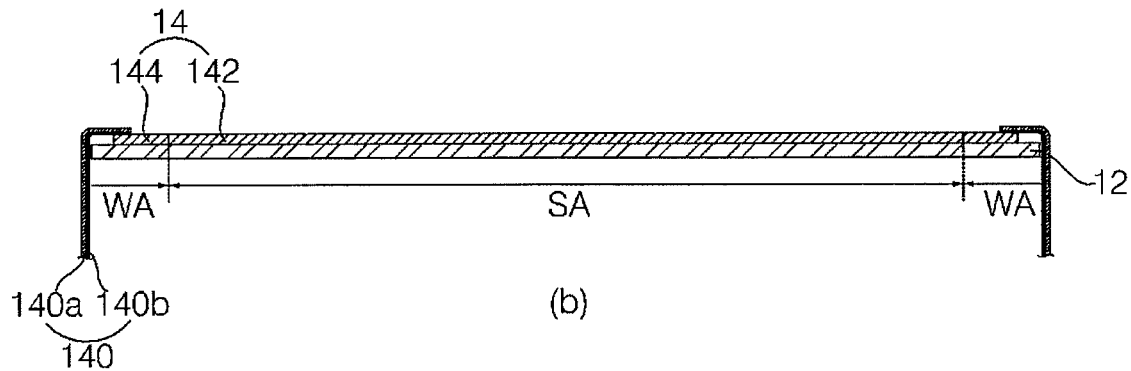

Next, as exemplarily shown in FIG. 5D, the first flexible printed circuit board 140 is disposed on the first wire electrode 144 so as to be electrically connected to the first wire electrode 144. In one example, a conductive adhesive member may be interposed between the first wire electrode 144 and the first flexible printed circuit board 140 to bond the same to each other. However, the present invention is not limited thereto and the first wire electrode 144 and the first flexible printed circuit board 140 may be connected to each other using various other methods.

Then, after the cover substrate 30, the first and second transparent adhesive layers 42 and 44, and the second conductive film 20 are stacked on the first conductive film 10 including the first electrode 14 fabricated as described above, bonding therebetween is implemented to integrally secure them to one another. In this way, the touch panel 10 as exemplarily shown in FIGS. 1 and 2 is fabricated. In a state in which the touch panel 100 fabricated as described above is disposed at the front surface of the display panel 300 using the transparent adhesive layer 302, ends of the first and second flexible printed circuit boards 140 and 240 are connected to the connectors 212 and 214 of the touch control unit 200 disposed at the rear surface of the display panel 300, completing fabrication of the display apparatus.

As described above, according to the present embodiment, the first conductive film 10 and/or the second conductive film 20, and the touch panel 100 and the display apparatus including the same may be fabricated in a simplified manner.

Hereinafter, touch panels and conductive films in accordance with different embodiments of the present invention will be described in detail. A detailed description of the same or similar parts to those of the above description will be omitted and only different parts will be described in detail.

Figure 6:
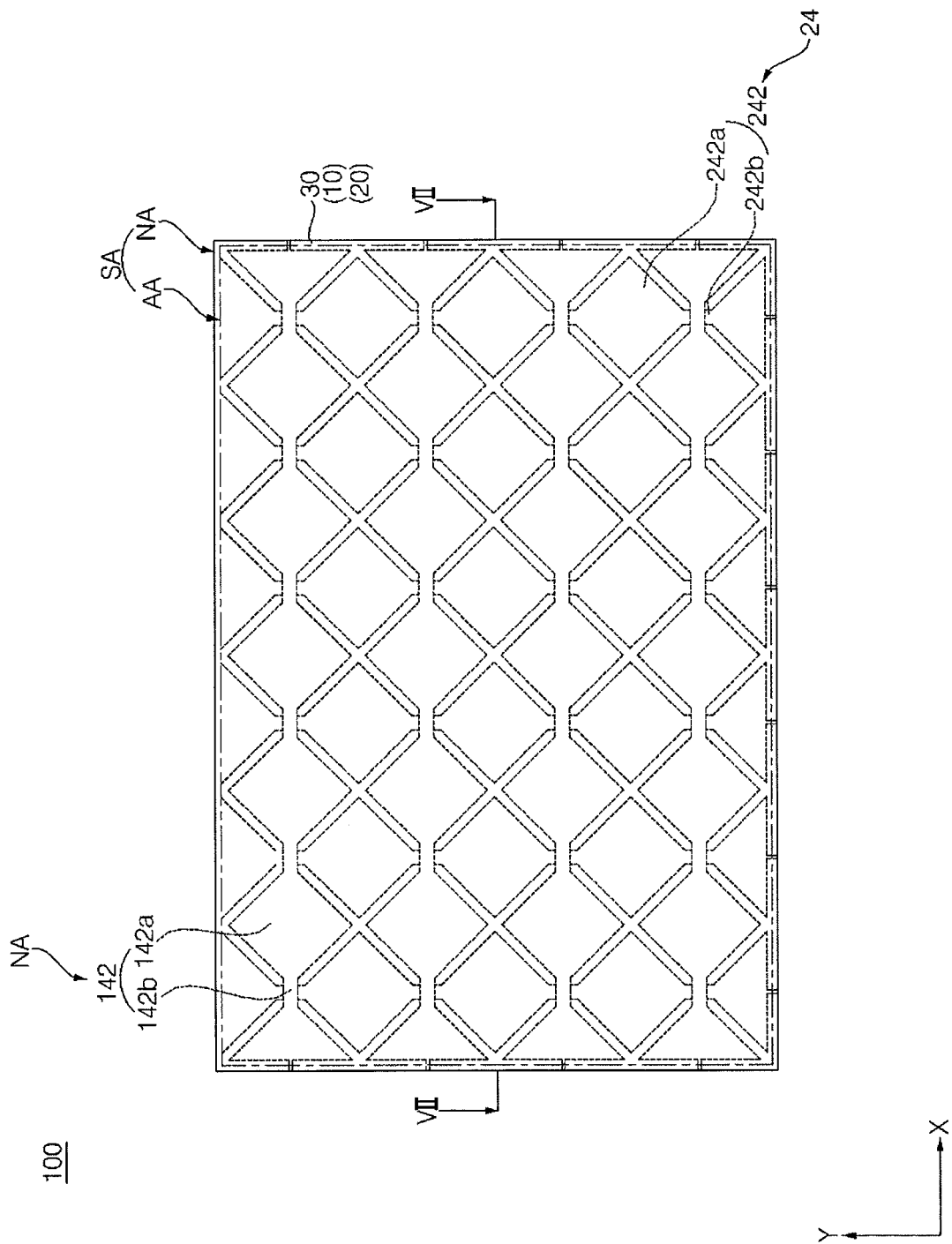
FIG. 6 is a plan view showing a touch panel in accordance with another embodiment of the present invention.
Figure 7:
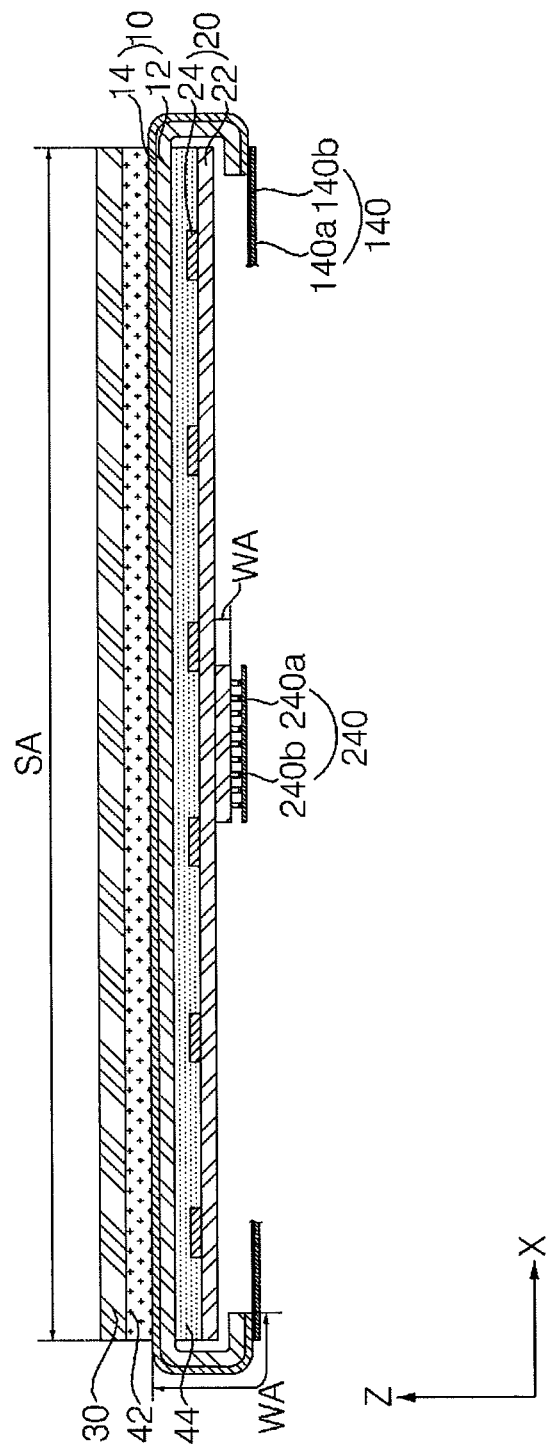
FIG. 7 is a sectional view taken along line VII-VII of FIG. 6.

FIG. 6 is a plan view showing a touch panel in accordance with another embodiment of the present invention. FIG. 7 is a sectional view taken along line VII-VII of FIG. 6, and FIG. 8 is a perspective view showing a first conductive film usable with the touch panel shown in FIG. 6.

Referring to FIGS. 6 and 7, in the touch panel 100 in accordance with the present embodiment, the sensor area SA of each of the first and second conductive films 10 and 20 occupies the entire front surface of the touch panel 100. More specifically, the wire area WA of each of the first and second conductive films 10 and 20 is not present at the front surface of the touch panel 100, and is present at a lateral surface and/or a rear surface of the touch panel 100. As such, the first wire electrode 144 and/or the second wire electrode 244 may be located at the lateral surface and/or the rear surface of the touch panel 100.

The drawing illustrates that the wire area WA of each of the first and second conductive films 10 and 20 extend to the rear surface of the touch panel 100 by way of the lateral surface of the touch panel 100 and is connected to the first or second flexible printed circuit board 140 or 240 at the rear surface of the touch panel 100. However, the present invention is not limited thereto, and the wire area WA of each of the first and second conductive films 10 and 20 may extend only to the lateral surface of the touch panel 100 and be connected to the first or second flexible printed circuit board 140 or 240 at the lateral surface of the touch panel 100.

Figure 8:
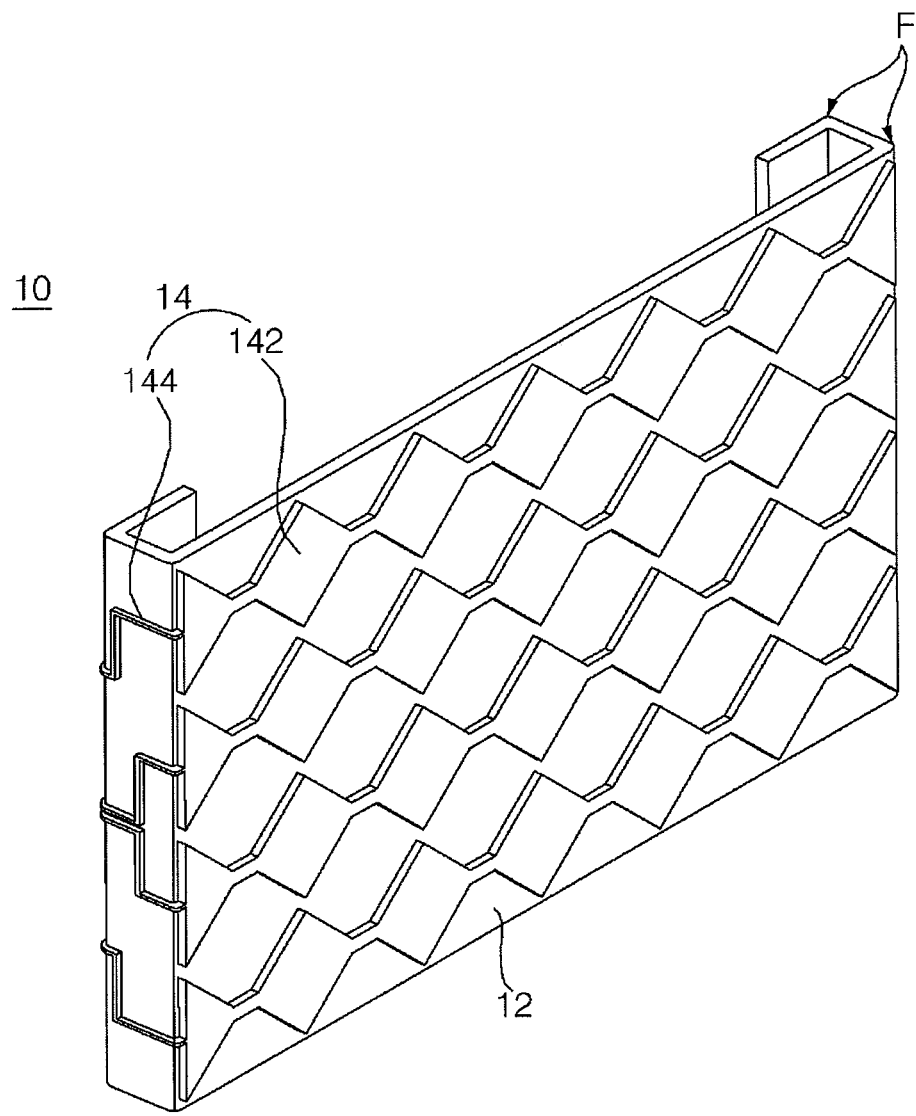
FIG. 8 is a perspective view showing a first conductive film usable with the touch panel shown in FIG. 6.

Referring to FIG. 8, in the present embodiment, the first conductive film 10 may include a folding portion F between the sensor area SA and the wire area WA. The folding portion F may refer to a folded portion of the first base member 12, or may refer to grooves, holes, and the like formed in the first base member 12 to assist the first base member 12 in being easily folded.

The drawing illustrates that the wire area WA of each of the first and second conductive films 10 and 20 extends to the rear surface of the touch panel 100 by way of the lateral surface of the touch panel 100. With this configuration, the folding portion F is present between the sensor area SA and the wire area WA and is also present in the wire area WA. However, the present invention is not limited thereto, and the wire area WA may extend only to the lateral surface of the touch panel 100 to provide a single folding portion F. Alternatively, the wire area WA may extend from the front surface to the rear surface of the touch panel 100 by way of the lateral surface such that two folding portions F are present in the wire area WA. Alternatively, both the sensor area SA and the wire area WA may be wholly bent. Various other alterations are possible.

As described above, in the present embodiment, at least a portion of the wire area WA of the first base member 12 may be folded so as to be positioned to cross the sensor area SA (e.g., to be tilted to or perpendicular to the sensor area SA). This is because the first sensor electrode 142 and the first wire electrode 144 formed on the first base member 12 take the form of a flexible conductive layer formed of a nano material conductor having a network shape. As a result of folding the wire area WA such that the wire area WA is located at the lateral surface and/or the rear surface of the touch panel 100, the first flexible printed circuit board 140 may be connected to the wire area WA at the rear surface and/or the lateral surface of the touch panel 100. FIG. 8 illustrates a configuration of the first conductive film 10 by way of example. It will be appreciated that the above description related to the first conductive film 10 may also be applied to the second conductive film 20.

Accordingly, as the wire area WA is not present at the front surface of the touch panel 100, the unavailable area NA of the touch panel 100 may have a minimum size or may be omitted. This may maximize the size of the available area AA as a substantial display and touch area, resulting in improved external appearance and user satisfaction.

Figure 9:
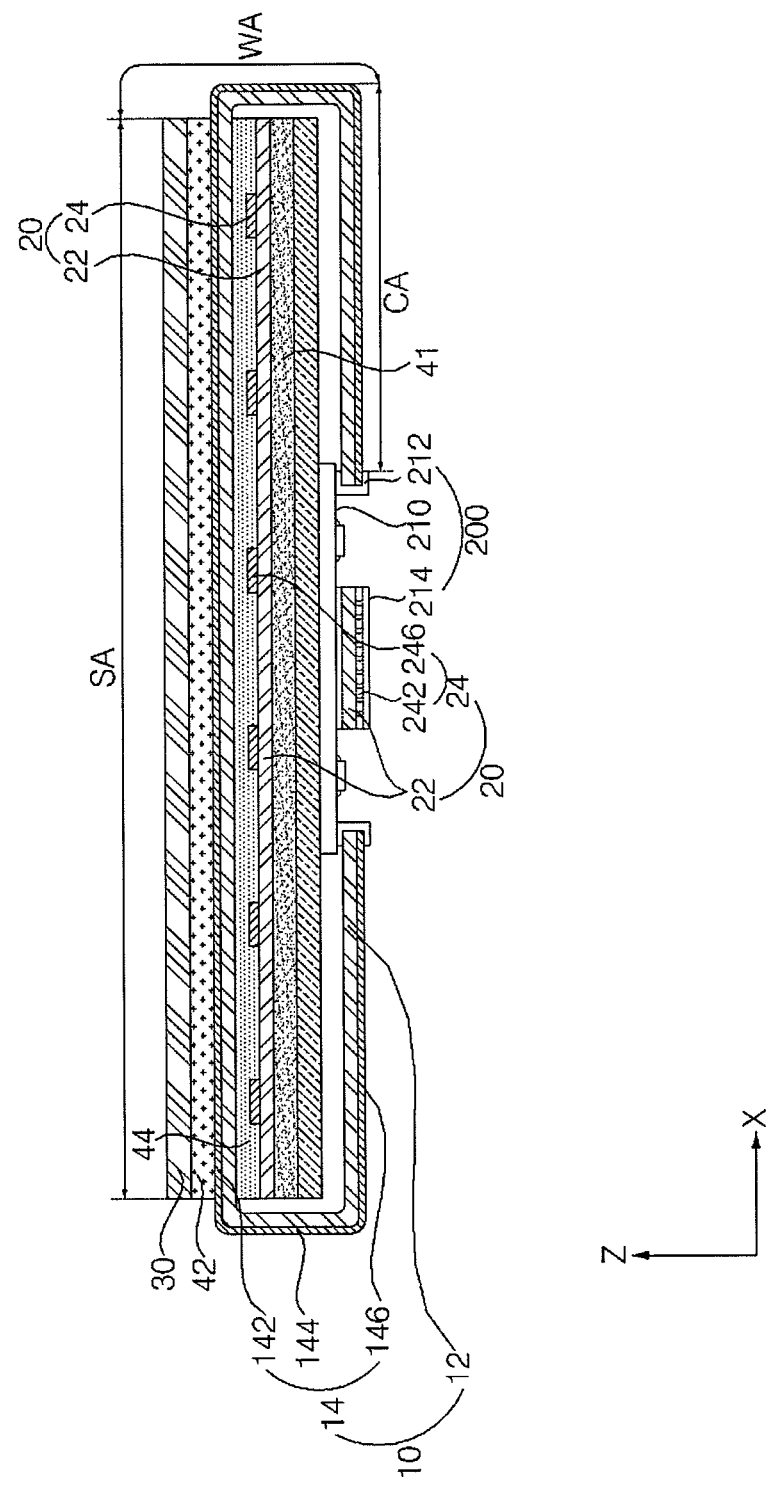
FIG. 9 is a sectional view showing a display apparatus including a touch panel in accordance with another embodiment of the present invention.
Figure 10:
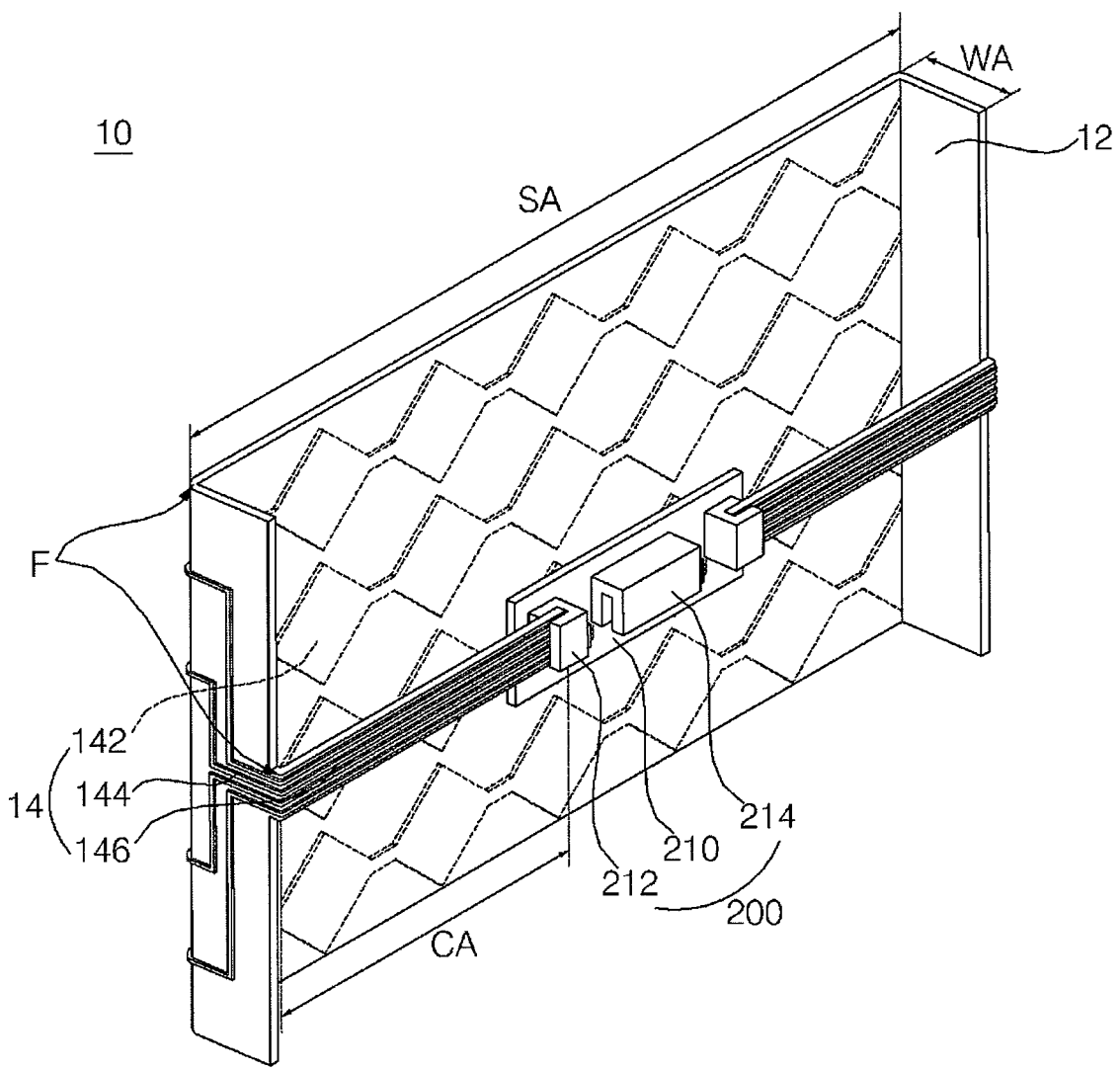
FIG. 10 is a perspective view showing a first conductive film and a touch control unit usable with the touch panel shown in FIG. 9.
Figure 10:
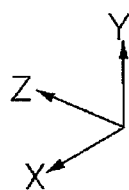

FIG. 9 is a sectional view showing a display apparatus including a touch panel in accordance with another embodiment of the present invention. FIG. 10 is a perspective view showing a first conductive film and a touch control unit usable with the touch panel shown in FIG. 9, and FIG. 11 is a perspective view showing a second conductive film and a touch control unit usable with the touch panel shown in FIG. 9.

Figure 11:
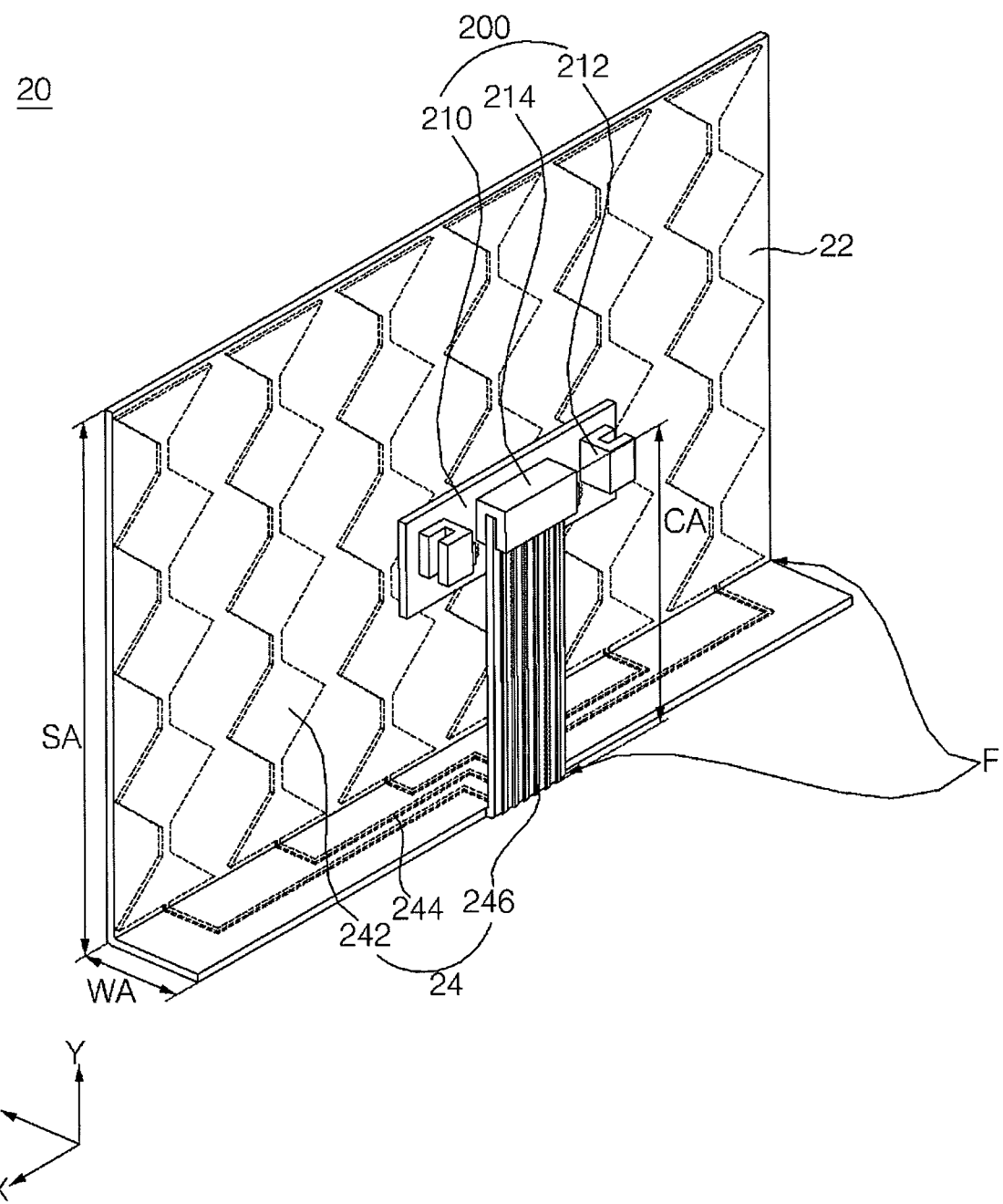
FIG. 11 is a perspective view showing a second conductive film and a touch control unit usable with the touch panel shown in FIG. 9.

Referring to FIGS. 9 to 11, in the touch panel 100 in accordance with the present embodiment, the sensor area SA of each of the first and second conductive films 10 and 20 occupies the entire front surface of the touch panel 100. More specifically, the wire area WA of each of the first and second conductive films 10 and 20 is not present at the front surface of the touch panel 100, and is present at the lateral surface and/or the rear surface of the touch panel 100.

In addition, in the present embodiment, the first conductive film 10 may include a connection area CA, in addition to the sensor area SA and the wire area WA. The connection area CA may serve as the first flexible printed circuit board 140 of the above described embodiments with reference to FIGS. 1 to 8. More specifically, the connection area CA may be provided with a first connection electrode 146, which extends from one end of the first wire electrode 144 formed in the wire area WA. That is, the first electrode 14 may include the first sensor electrode 142, the first wire electrode 144, and the first connection electrode 146.

One end of the first connection electrode 146 is electrically connected to the first wire electrode 144 and the other end of the first connection electrode 146 is connected (for example, directly connected) to the connector 212 of the touch control unit 200. In this case, the first sensor electrode 142, the first wire electrode 144, and the first connection electrode 146 may be formed of the same material, may have the same or similar thickness (for example, having a thickness difference less than 10%), and may continuously extend to construct an integrated structure.

Accordingly, in the present embodiment, the first connection electrode 146, which connects the first wire electrode 144 and the touch control unit 200 to each other, may be formed of a transparent conductive material, and for example, may include a nano material conductor having a network shape. The nano material conductor having a network shape has been described above in detail upon explanation of the first sensor electrode 142 and the first wire electrode 144, and thereafter a detailed description thereof will be omitted hereinafter.

Similarly, in the present embodiment, the second conductive film 20 may include a connection area CA, in addition to the sensor area SA and the wire area WA. The connection area CA may serve as the second flexible printed circuit board 240 of the above described embodiments with reference to FIGS. 1 to 8. More specifically, the connection area CA may be provided with a second connection electrode 246, which extends from one end of the second wire electrode 244 formed in the wire area WA. That is, the second electrode 24 may include the second sensor electrode 242, the second wire electrode 244, and the second connection electrode 246.

One end of the second connection electrode 246 is electrically connected to the second wire electrode 244 and the other end of the second connection electrode 246 is connected (for example, directly connected) to the connector 214 of the touch control unit 200. In this case, the second sensor electrode 242, the second wire electrode 244, and the second connection electrode 246 may be formed of the same material, may have the same or similar thickness (for example, having a thickness difference less than 10%), and may continuously extend to construct an integrated structure.

Accordingly, in the present embodiment, the second connection electrode 246, which connects the second wire electrode 244 and the touch control unit 200 to each other, may be formed of a transparent conductive material, and for example, may include a nano material conductor having a network shape. The nano material conductor having a network shape has been described above in detail upon explanation of the second sensor electrode 242 and the second wire electrode 244, and thereafter a detailed description thereof will be omitted hereinafter.

The present embodiment illustrates that the wire area WA of each of the first and second conductive films 10 and 20 is located at the lateral surface of the touch panel 100 and the connection area CA is located at the rear surface of the touch panel 100. With this configuration, the folding portion F is present between the sensor area SA and the wire area WA and is also present between the wire area WA and the connection area CA. However, the present invention is not limited thereto, and the wire area WA may extend to the rear surface of the touch panel 100 by way of the lateral surface of the touch panel 100 such that one folding portion F is present between the sensor area SA and the wire area WA and another folding portion F is present in the wire area WA. Alternatively, the wire area WA may extend from the front surface to the rear surface of the touch panel 100 by way of the lateral surface such that two folding portions F are present in the wire area WA. Alternatively, the wire area WA may extend from the front surface to the lateral surface of the touch panel 100 such that one folding portion F is present in the wire area WA, and the connection area CA may extend from the lateral surface to the rear surface of the touch panel 100 such that another folding portion F is present in the connection area CA. Alternatively, the sensor area SA, the wire area WA, and the connection area CA may be wholly bent. Various other alterations are possible.

As described above, in the present embodiment, since the first conductive film 10 and/or the second conductive film 20 incorporate the connection area CA serving as the first flexible printed circuit board 140 and/or the second flexible printed circuit board 240, omission of a flexible printed circuit board is possible. This may reduce material costs due to the flexible printed circuit board, and may simplify the entire process owing to emission of an attachment process for the flexible printed circuit board.

Figure 12:
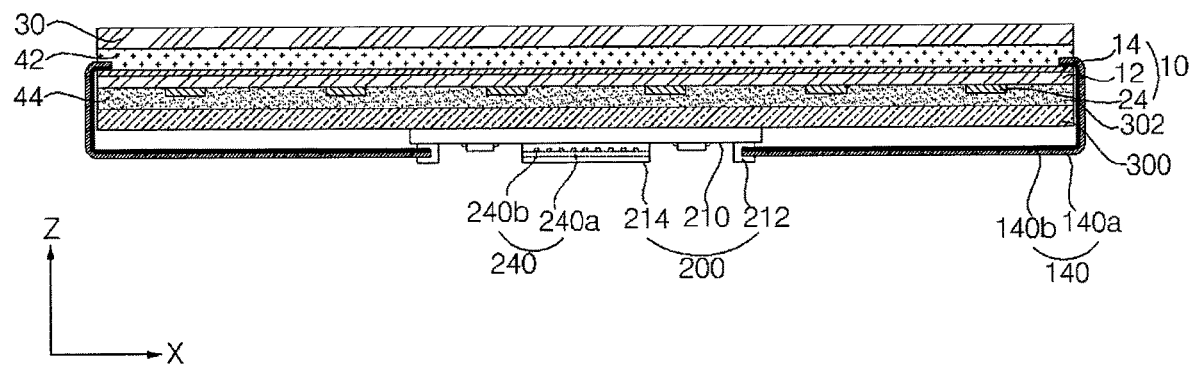
FIG. 12 is a sectional view showing a display apparatus including a touch panel in accordance with another embodiment of the present invention.

FIG. 12 is a sectional view showing a display apparatus including a touch panel in accordance with another embodiment of the present invention.

Referring to FIG. 12, the touch panel in accordance with the present embodiment includes the cover substrate 30, the first transparent adhesive layer 42 disposed on the cover substrate 30, and the first conductive film 10 disposed on the first transparent adhesive layer 42, the first conductive film 10 having the first electrode 14 formed on one surface thereof and the second electrode 24 formed on the other surface thereof. More specifically, in the present embodiment, two electrodes included in the touch panel, such as the first and second electrodes 14 and 24 are disposed at different surfaces of the first base member 12. This configuration may simplify a configuration of the touch panel 100 and reduce the number of base members that are components having the greatest thickness among the constituent components of the touch panel, thereby enabling construction of a thin touch panel.

Although the drawing shows an altered configuration of FIG. 2, the present invention is not limited thereto. The configuration shown in FIGS. 6 to 11 may be altered as described above, and various other alterations are possible.

Figure 13:
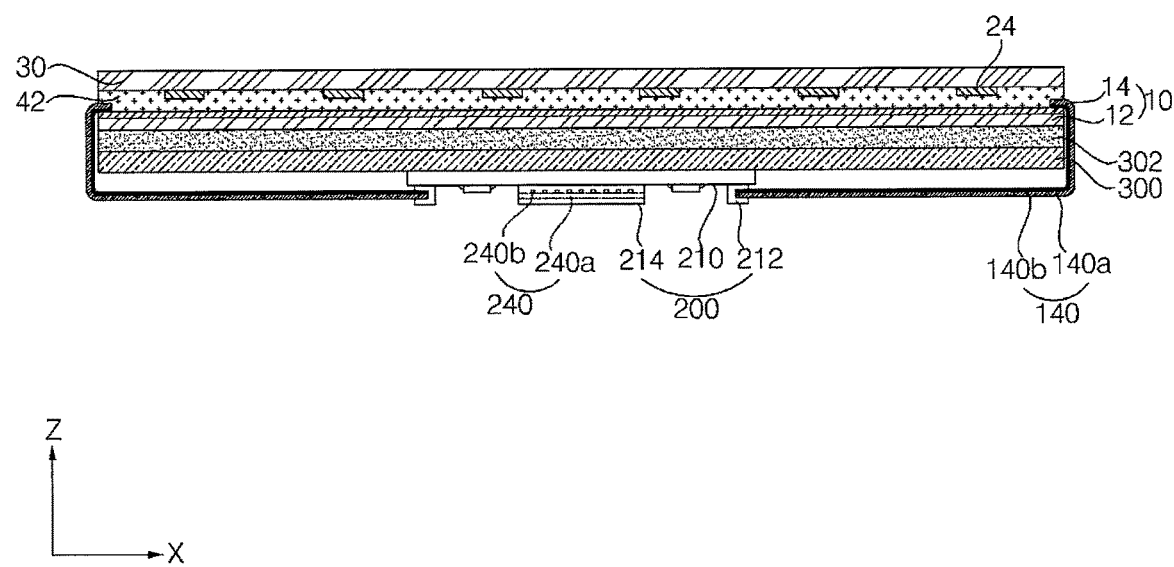
FIG. 13 is a sectional view showing a display apparatus including a touch panel in accordance with another embodiment of the present invention.

FIG. 13 is a sectional view showing a display apparatus including a touch panel in accordance with another embodiment of the present invention.

Referring to FIG. 13, the touch panel in accordance with the present embodiment includes the cover substrate 30 provided with the second electrode 24, the first transparent adhesive layer 42 disposed on the cover substrate 30 to cover the second electrode 24, and the first conductive film 10 disposed on the first transparent adhesive layer 42 and provided with the first electrode 14. According to the present embodiment, as a result of providing the cover substrate 30 with the second electrode 24, the touch panel may have a simplified configuration and a minimized thickness.

In this case, the second electrode 24 and the first electrode 14 may be formed of the same material, or different materials. In one example, when the second electrode 24 is formed of indium tin oxide, the second electrode 24 may be easily formed on the cover substrate 30. A resistance difference due to different constituent materials of the first electrode 14 and the second electrode 24 may be eliminated via adjustment in the thicknesses of the first electrode 14 and the second electrode 24. Alternatively, in a case in which the touch panel has different horizontal and vertical lengths, the first electrode 14 having a lower resistance may be arranged to extend along a longer length of the touch panel, and the second electrode having a higher resistance may be arranged to extend along a shorter length of the touch panel. Various other alterations are possible.

Although the drawing shows an altered configuration of FIG. 2, the present invention is not limited thereto. The configuration shown in FIGS. 6 to 11 may be altered as described above, and various other alterations are possible.

Figure 14:
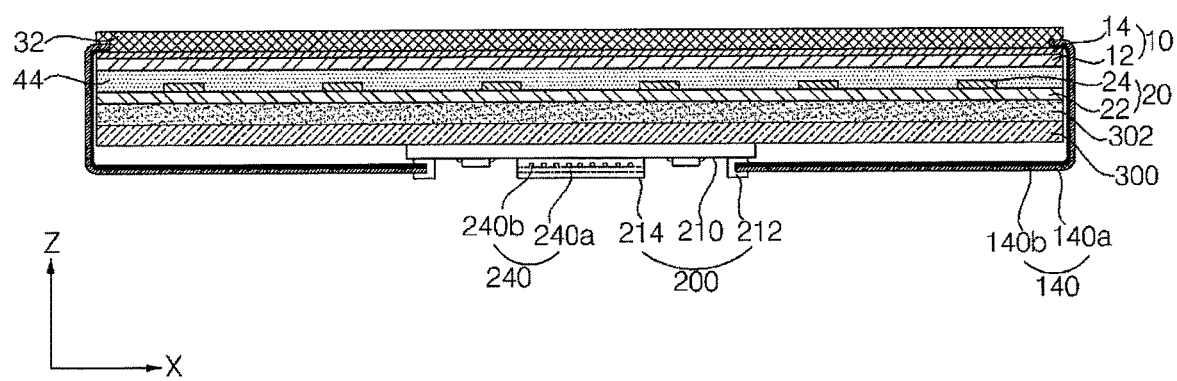
FIG. 14 is a sectional view showing a display apparatus including a touch panel in accordance with another embodiment of the present invention.

FIG. 14 is a sectional view showing a display apparatus including a touch panel in accordance with another embodiment of the present invention.

Referring to FIG. 14, in the present embodiment, instead of the cover substrate 30 and the first transparent adhesive layer 42, a hard coating layer may be disposed at the front surface of the first conductive film 10. The hard coating layer 32 may be formed of an acryl resin, for example. Removal of the cover substrate 30 and the first transparent adhesive layer 42 may reduce material costs and also considerably reduce a thickness of the touch panel.

Although the drawing shows an altered configuration of FIG. 2, the present invention is not limited thereto. The configuration shown in FIGS. 6 to 11 may be altered as described above, and various other alterations are possible.

Figure 15:
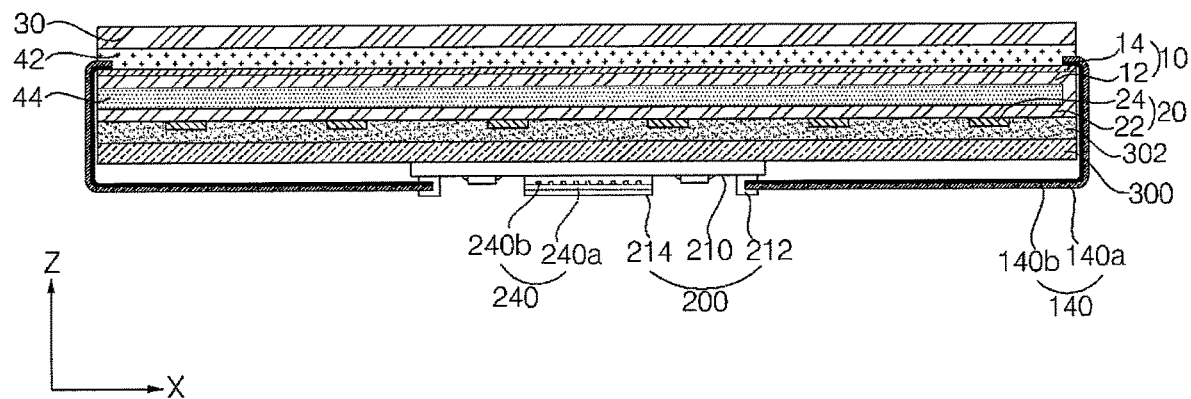
FIG. 15 is a sectional view showing a display apparatus including a touch panel in accordance with a further embodiment of the present invention.

FIG. 15 is a sectional view showing a display apparatus including a touch panel in accordance with a further embodiment of the present invention.

Referring to FIG. 15, in the touch panel in accordance with the present embodiment, the first conductive film 10 and the second conductive film 20 may be connected to each other to construct an integrated structure. More specifically, the first base member 12 of the first conductive film 10 and the second base member 22 of the second conductive film 20 are continuously or successively formed to form the same layer and to construct an integrated structure, and the first electrode of the first conductive film 10 and the second electrode 24 of the second conductive film 20 may be formed on the first and second base members 12 and 22 of the same layer respectively. More specifically, after the first electrode 14 and the second electrode 24 are formed on a single base member structure including the first base member 12 and the second base member 22, the single base member structure may be folded such that a portion of the single base member structure provided with the first electrode 14 and a portion of the single base member structure provided with the second electrode 24 overlap each other with the second transparent adhesive layer 44 interposed therebetween. Thereby, the portion of the single base member structure provided with the first electrode 14 is disposed at one surface of the second transparent adhesive layer 44 and the portion of the single base member structure provided with the second electrode 24 is disposed at the other surface of the second transparent adhesive layer 44. In this way, the first electrode 14 and the second electrode 24 may be spaced apart from each other and be insulated from each other by the second transparent adhesive layer 44, and the first conductive film 10 and the second conductive film 20 (more particularly, the first base member 12 and the second base member 22) may be connected to each other at one edge of the second transparent adhesive layer 44.

The drawing illustrates that the first electrode 14 and the second electrode 24 are initially arranged on the same surface of the single base member structure including the first base member 12 and the second base member 22, and after folding of the single base member structure, the first electrode 14 is disposed at one surface of the single base member structure facing the cover substrate 30 and the second electrode 24 is disposed at the other surface of the single base member structure opposite to the cover substrate 30. However, the present invention is not limited thereto. Thus, the first electrode 14 may be disposed at the surface of the single base member structure opposite to the cover substrate 30, and/or the second electrode 24 may be disposed at the surface of the single base member structure facing the cover substrate 30. Various other alterations are possible.

According to the present embodiment, the first conductive film 10 and the second conductive film 20 may form a single conductive film, which may simplify a fabrication process.

Although the drawing shows an altered configuration of FIG. 2, the present invention is not limited thereto. The configuration shown in FIGS. 6 to 11 may be altered as described above, and various other alterations are possible.

The above described features, configurations, effects, and the like are included in at least one of the embodiments of the present invention, and should not be limited to only one embodiment. In addition, the features, configurations, effects, and the like as illustrated in each embodiment may be implemented with regard to other embodiments as they are combined with one another or modified by those skilled in the art. Accordingly, content related to these combinations and modifications should be construed as being included in the scope and spirit of the invention.

What is claimed is:

1. A touch panel comprising:
 a first conductive film including:
 a first base member having a first folding portion extending in a first direction and a second folding portion spaced apart from the first folding portion in a second direction crossing the first direction and extending in the first direction so that the first base member includes a front side, a lateral side between the first folding portion and the second folding portion, and a rear side parallel to the first side;
 a plurality of first sensor electrodes extending in a third direction crossing both of the first direction and the second direction to be spaced apart from each other in the first direction on the front side of the first base member;
 a plurality of first wire electrodes being connected to the plurality of first sensor electrodes, respectively, to be spaced apart from each other in the first direction on the lateral side of the first base member; and
 a plurality of first connection electrodes extending in the third direction to be spaced apart from each other in the first direction on the rear side of the first base member, wherein the plurality of first connection electrodes connecting the plurality of first wire electrodes to a touch control unit such that the rear side of the first base member and the plurality of first connection electrodes act as a flexible printed circuit board;
 a second conductive film including:
 a second sensor electrode extending in the first direction to be spaced apart each other in the third direction, the second sensor electrode being spaced apart from the first sensor electrode;
 a second wire electrode connected to the second sensor electrode; and
 a second base member on which the second sensor electrode and the second wire electrode are located;
 a cover substrate disposed on the first conductive film, the cover substrate having a first surface facing the first conductive film and a second surface opposite to the first surface and forming an outer surface; and
 a transparent adhesive layer interposed between the first conductive film and the first surface of the cover substrate,
 wherein the plurality of first connection electrodes, the plurality of first sensor electrodes and the plurality of first wire electrodes are formed of a same transparent conductive layer including a nano material conductor having a network shape to provide an integrated structure on the same first base member, wherein the plurality of first wire electrodes have a first distance at the first folding portion in the first direction and a second distance smaller than the first distance at the second folding portion in the first direction such that a first width of the rear side of the first base member acting as the flexible printed circuit board in the first direction is smaller than a second width of the lateral side of the first base member in the first direction, and wherein the second conductive film has at least one another folding portion extending in the third direction.

2. The touch panel according to claim 1, wherein the second base member extends from the first base member such that the first base member and the second base member provide an integrated structure.

3. The touch panel according to claim 2, wherein another transparent adhesive layer is interposed between the first conductive film and the second conductive film to attach the first and second conductive films to each other.

4. The touch panel according to claim 1, wherein the plurality of first sensor electrodes and the plurality of first wire electrodes are located at one surface of the first conductive film, and the second sensor electrode is located at another surface of the first conductive film opposite the first surface.

5. The touch panel according to claim 1, wherein the second sensor electrode is located on the first surface of the cover substrate.

6. The touch panel according to claim 1, wherein the second conductive film has a front side, another lateral side extending in a direction crossing the lateral side of the first conductive film, and a rear side by the at least one another folding portion.

7. The touch panel according to claim 6, wherein the second conductive film further includes a second connection electrode on the rear side of the second conductive film, and wherein the second connection electrode connects the second wire electrode to the touch control unit such that the rear side of the second base member and the second connection electrode act as another flexible printed circuit board.

* * * * *